(12) United States Patent
Chang et al.

(10) Patent No.: US 8,803,183 B2
(45) Date of Patent: Aug. 12, 2014

(54) LED HEAT-CONDUCTING SUBSTRATE AND ITS THERMAL MODULE

(75) Inventors: Yi-Shun Chang, Kaohsiung (TW); Syh-Yuh Cheng, Douliu (TW)

(73) Assignee: Ho Cheng Industrial Co., Ltd., Douliu, Yunlin County (TW)

( * ) Notice: Subject to any disclaimer, the term of this patent is extended or adjusted under 35 U.S.C. 154(b) by 252 days.

(21) Appl. No.: 12/903,710

(22) Filed: Oct. 13, 2010

(65) Prior Publication Data
US 2012/0092833 A1  Apr. 19, 2012

(51) Int. Cl.
*H01L 29/66* (2006.01)

(52) U.S. Cl.
USPC .............. 257/99; 257/100; 257/E33.066

(58) Field of Classification Search
USPC ......... 257/77–103, E33.066, 333.075, 33.075
See application file for complete search history.

(56) References Cited

U.S. PATENT DOCUMENTS

| | | | | |
|---|---|---|---|---|
| 5,280,409 | A * | 1/1994 | Selna et al. | 361/720 |
| 6,984,799 | B2 * | 1/2006 | Kawaguchi et al. | 200/512 |
| 7,095,053 | B2 * | 8/2006 | Mazzochette et al. | 257/81 |
| 7,550,319 | B2 * | 6/2009 | Wang et al. | 438/125 |
| 8,212,271 | B2 * | 7/2012 | Kotani et al. | 257/98 |
| 2002/0149102 | A1 * | 10/2002 | Hashemi et al. | 257/706 |
| 2005/0067635 | A1 * | 3/2005 | Saito | 257/222 |
| 2005/0070048 | A1 | 3/2005 | Tolchinsky et al. | |
| 2006/0006524 | A1 | 1/2006 | Hsieh | |
| 2006/0243972 | A1 * | 11/2006 | Uang et al. | 257/40 |
| 2007/0176182 | A1 | 8/2007 | Wen | |
| 2007/0207417 | A1 | 9/2007 | Fujiwara | |
| 2008/0057333 | A1 | 3/2008 | Chu | |
| 2008/0073623 | A1 | 3/2008 | Wang | |
| 2008/0190542 | A1 | 8/2008 | Tuan | |
| 2008/0291688 | A1 * | 11/2008 | Higashi | 362/516 |
| 2009/0151982 | A1 | 6/2009 | Oshika | |
| 2009/0283779 | A1 * | 11/2009 | Negley et al. | 257/88 |
| 2009/0290362 | A1 | 11/2009 | Wei | |
| 2010/0001309 | A1 * | 1/2010 | Wang et al. | 257/99 |
| 2010/0033976 | A1 * | 2/2010 | Sun et al. | 362/382 |
| 2010/0110692 | A1 | 5/2010 | Yu | |
| 2010/0163890 | A1 * | 7/2010 | Miskin | 257/88 |
| 2010/0255742 | A1 * | 10/2010 | Yun et al. | 442/117 |

FOREIGN PATENT DOCUMENTS

| | | |
|---|---|---|
| JP | 2154049 A | 6/1990 |
| JP | 5090437 A | 4/1993 |
| JP | 2000297301 A | 10/2000 |
| JP | 2000303126 A | 10/2000 |

(Continued)

*Primary Examiner* — Cuong Q Nguyen
*Assistant Examiner* — Yosef Gebreyesus
(74) *Attorney, Agent, or Firm* — Egbert Law Offices, PLLC (57) ABSTRACT

An LED heat-conducting substrate and its thermal module wherein the composite heat-conducting substrate is incorporated by multiple heat-conducting wires or fibers and insulating material. Said wires or fibers are arranged at interval, and penetrate the front and rear faces. The wires or fibers are segregated by insulating material. An electrode pad is incorporated onto the front face of the composite heat-conducting substrate, and is electrically connected with the electrode pin of LED unit. A heat-conducting pad is incorporated and kept in contact with the heat sink of the LED component for heat conduction. An insulating layer is incorporated onto the rear face of the composite heat-conducting substrate, and located correspondingly to the electrode pad. The LED heat-conducting substrate and thermal module can be constructed easily for high heat conduction in the thickness direction and high electrical insulation in the direction of plane, enabling quick heat transfer to the heat-sinking component.

11 Claims, 6 Drawing Sheets

(56) References Cited

FOREIGN PATENT DOCUMENTS

| | | | |
|---|---|---|---|
| JP | 2002289747 A | 10/2002 |
| JP | 2003073169 A | 3/2003 |
| JP | 2004047863 A | 2/2004 |
| JP | 2004165421 A | 6/2004 |
| JP | 2005072069 A | 3/2005 |
| JP | 2006060247 A | 3/2006 |
| JP | 2006165158 A | 6/2006 |
| JP | 2006190705 A | 7/2006 |
| JP | 2007173536 A | 7/2007 |
| JP | 2008060535 A | 3/2008 |
| JP | 2008081722 A | 4/2008 |
| JP | 2008159827 A | 7/2008 |
| JP | 2009123980 A | 6/2009 |
| JP | 2009188308 A | 8/2009 |
| JP | 2009194277 A | 8/2009 |
| JP | 2009266972 A | 11/2009 |
| KR | 20080028258 A | 3/2008 |
| TW | 224873 B | 12/2004 |

\* cited by examiner

LED HEAT-CONDUCTING SUBSTRATE AND ITS THERMAL MODULE

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a composite substrate, and more particularly to an innovative one which is configured into an electronic type. The present invention also relates to an LED heat-conducting substrate and its thermal module, and more particularly to an innovative one which is made of metal or carbon heat-conducting wire or fiber and insulating material having higher thermal conductivity and insulation property.

2. Description of Related Art Including Information Disclosed Under 37 CFR 1.97 and 37 CFR 1.98

An active LED may generate heat energy due to relatively low transfer efficiency of electric energy to optical energy. As for a high light intensity, high-power LED that generates more heat energy, if the heat energy cannot be released, the temperature of the LED will rise, leading to its color bias and degradation.

As a priority of design for LED, heat dissipation means heat energy is transferred from heat-conducting material to a heat exchanger, and then dissipated into the air via larger surface area of the heat exchanger. Said heat exchanger generally consists of extruded aluminum or die-casting fins, permitting the transfer of heat energy to the surface of fins using high heat transfer characteristic of aluminum and then enabling heat exchange with air. In practice, several LEDs form a light source, so a module structure is required to be configured with several LEDs, and these LEDs and power circuit are welded onto a circuit board with stronger heat-conducting capability, so that the heat energy of LED can be transferred to a heat exchanger while avoiding temperature rise and damage of components.

Heat transfer design required for LED generally encompasses chip package and module structure, both of which are provided with a substrate for connecting with the LED electrode and heat conduction. The substrate for chip package is taken as the carrier of LED chip to obtain higher heat transfer property, and made of high conducting and insulating materials such as: alumina, AIN, diamond-plated metal membrane, aluminum-containing silicon carbide or diamond composites, as disclosed in patents JP2000297301, JP2000303126, TW224873 and JP2003073169. In order to realize higher compactness of the interface contact and reduce thermal resistance of heat conduction generated from the interface, a heat-conducting layer is fabricated directly onto the semi-conductor substrate, or thermal stress is cut down through the composite design of heat-conducting layer, as disclosed in patents US2005070048, JP2005072069, JP2006060247, JP2006190705 and US708359. In addition, some through-holes are drilled onto the substrate to dissipate the heat quickly, and high heat-conducting materials (e.g.: metal bond) are filled into the through-holes, as disclosed in patents JP2002289747, JP5090437 and US2006006524. Moreover, the electrode pad of LED chips is welded by metal sheets to dissipate the heat energy, as disclosed in patents JP2009266972, JP2009194277 and JP2009188308. Due to the small size of substrate for chip package, ceramic material of higher insulation and thermal conduction can be used in collaboration with the through-holes to fabricate a heat-conducting channel, such that the packaged LED is provided with a high heat-conducting structure. Furthermore, the heat from chips can be dissipated from a conducting weld connected at bottom of the chips, as disclosed in patents US20100110692 and US20070176182.

The packaged LED is provided with a terminal electrode or metal electrode pins and conductive contact, so welding electrode and conductive contact are available for assembly of LED circuit board, making it possible for electrical connection and heat dissipation through the circuit board. Generally, the circuit board is provided with multiple LEDs, so it is sized bigger than the chip package substrate. PCB is commonly used in view of poorer mechanical strength of ceramic substrate. Made of phenolic resin and glass fiber, PCB has a heat conductivity lower than 0.5 W/m° K, but encounters a temperature rise problem for high-power applications. To improve heat conduction efficiency, a metal substrate coated with insulating layers at both sides is generally adopted, as disclosed in patents US20080057333, JP2004047863, US2009151982, US20080190542, JP2009123980 and JP2008159827. In addition, the substrates made of crystalline polymer with thermoset and thermoplastic organic materials are introduced to improve the heat conductivity, which contain metal powder or nitride fiber of high thermal conductivity, as disclosed in patents US2008057333, JP2008060535, JP2006165158, JP2154049, JP2004165421, KR20080028258, US2008073623 and JP2008081722. However, the heat conduction coefficient of the substrates made of polymer organic materials is difficult to reach 5 W/m ° K. Due to better heat conductivity than organic materials, the porous ceramic materials can be filled into the holes to improve the heat conduction effect, as disclosed in patents US20090290362 and JP2007173536, etc.

LED substrates generally consist of electrode and heat-conducting contacts. Despite the high heat conductivity of metal materials, a short circuit may occur if the electrode is directly welded onto metal substrates, so a metal surface must be provided with an electrical insulator. Except for diamond and nitride, the insulating materials present poor heat conductivity and resistance to mechanical impact. In such a case, the problems of high cost and poorer resistance to mechanical impact are confronted if high heat-conducting insulative substrate is applied. If low-cost PCB is used as the substrate, it is not suitable for high intensity lighting due to poor heat conductivity. If insulating film of poor heat conductivity is coated onto the metal substrate, the composite substrate's heat conductivity is relatively poor. With the growing market demand, the cost of high-power LEDs must be reduced; hence, the technical development is focused on the substrate serving as LED electrode pad having lost cost and high heat conductivity.

Thus, to overcome the aforementioned problems of the prior art, it would be an advancement if the art to provide an improved structure that can significantly improve the efficacy.

Therefore, the inventor has provided the present invention of practicability after deliberate experimentation and evaluation based on years of experience in the production, development and design of related products.

BRIEF SUMMARY OF THE INVENTION

The enhanced efficacy of the present invention is as follows:

Based on the unique configuration of the present invention wherein the "LED heat-conducting substrate and its thermal module" mainly comprises a composite heat-conducting substrate, LED unit, electrode pad, insulating layer and heat-conducting pad, the LED heat-conducting substrate and its thermal module can be constructed easily for high heat conduction in the thickness direction and high insulation in the direction of plane, enabling quick heat transfer to the heat-sinking component while providing electrical insulation. So, the present invention is configured to provide a high-intensity LED product preferably suitable for heat-sinking structure with better practicability and economic benefits.

The improvements brought about by this invention are as follows:

First, the heat-conducting wire or fiber is used to form composite substrate with high heat conduction in the thickness direction and high electrical insulation in the direction of plane, helping to resolve the problems of conventional substrate and making it possible to provide an LED substrate with high heat conductivity.

Second, said composite heat-conducting substrate is positioned together with the heat-sinking component via a fixture and bolt, thus reducing the spacing between the composite heat-conducting substrate and heat-sinking component. Due to elasticity of the fixture, this can prevent the loosening of fixed position in response to thermal stress damage for the composite heat-conducting substrate and heat-sinking component.

Third, based on the configuration wherein said electrode pad and heat-conducting pad are made of sputtering or electroplating metal film or printed solder paste, said solder paste can be printed directly onto the composite heat-conducting substrate, then the electrode pad, heat-conducting pad and composite heat-conducting substrate can be mated stably by heating solder paste.

Fourth, based on the structural configuration wherein the area of said heat-conducting pad is 2-5 times of the electrode pad, the number of heat-conducting wires can be increased to improve the channel of heat transfer and enhance heat transfer to the heat-sinking component.

Although the invention has been explained in relation to its preferred embodiment, it is to be understood that many other possible modifications and variations can be made without departing from the spirit and scope of the invention as hereinafter claimed.

DETAILED DESCRIPTION OF THE INVENTION

FIGS. 1-4 depict preferred embodiments of an LED heat-conducting substrate and its thermal module of the present invention, which, however, are provided for only explanatory objective for patent claims.

Figure 1:
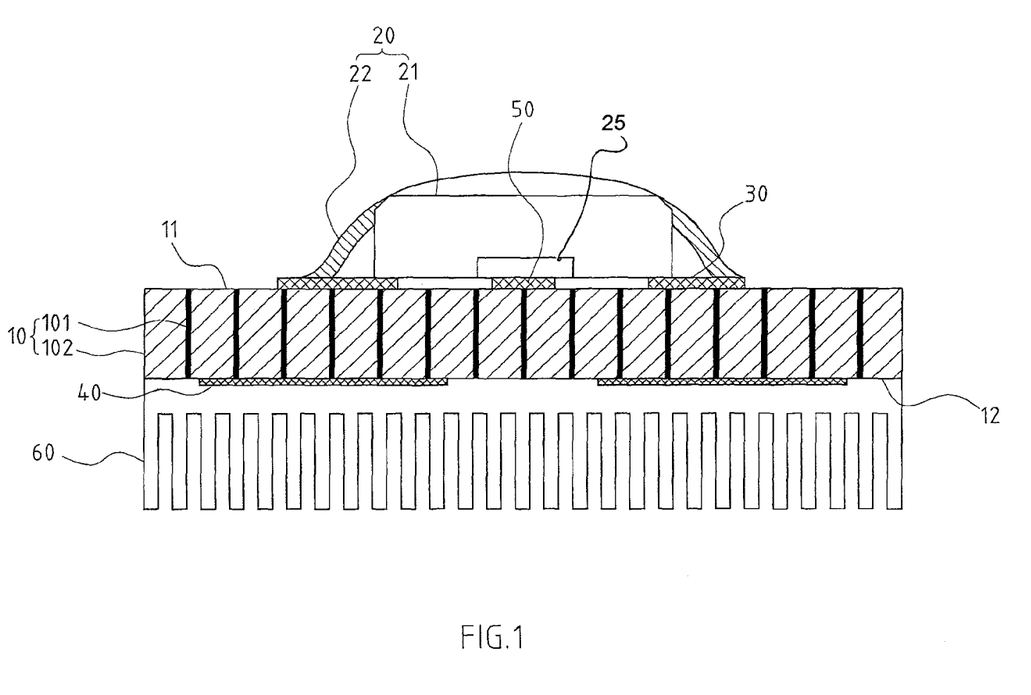
FIG. 1 is an assembled perspective view of the preferred embodiment of the present invention.
Figure 2:
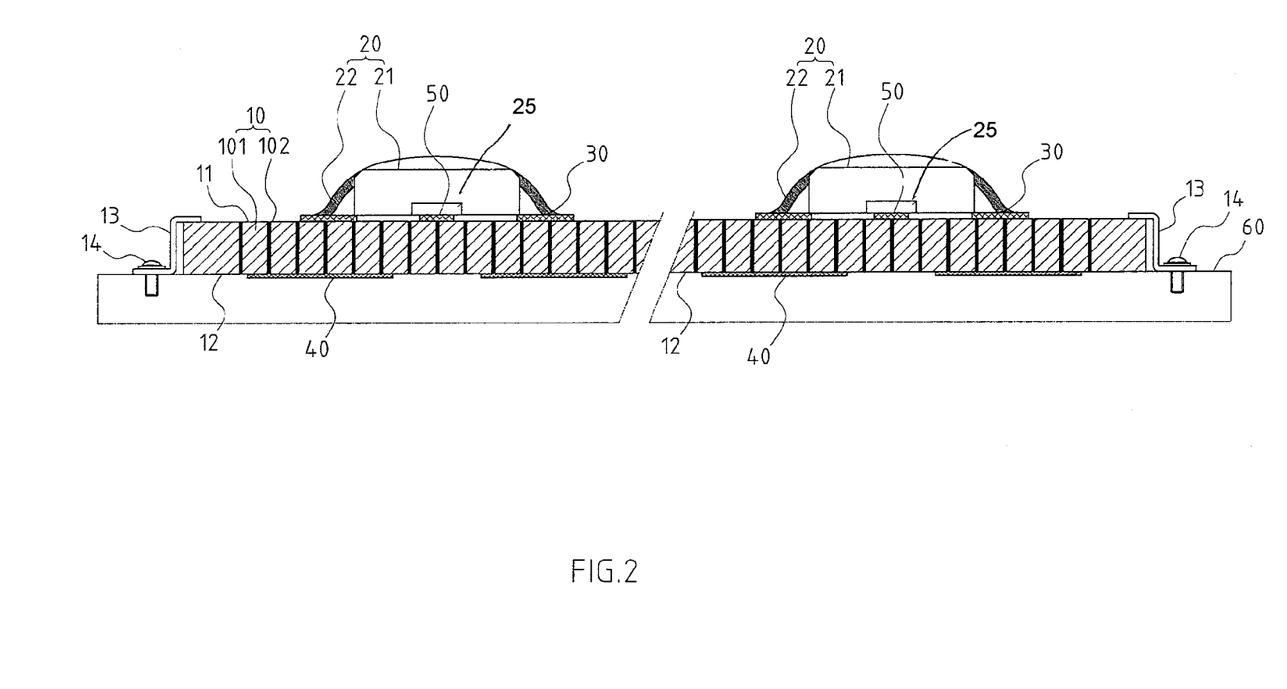
FIG. 2 is a schematic view of the present invention wherein the composite heat-conducting substrate is assembled by the fixture.
Figure 3:
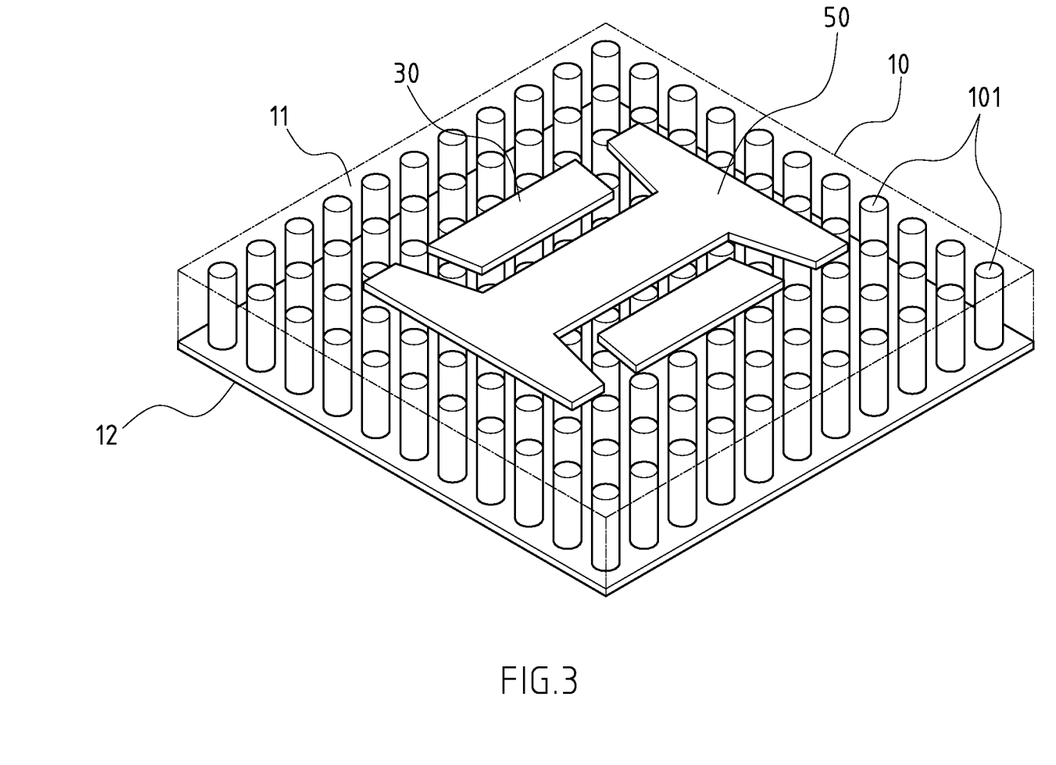
FIG. 3 is a 3D schematic view of the composite heat-conducting substrate of the present invention.

Said LED heat-conducting substrate and its thermal module comprising a composite heat-conducting substrate 10, incorporated by multiple heat-conducting wires 101 or fibers and insulating material 102, and defined to form a front face 11 and a rear face 12, of which said heat-conducting wires 101 or fibers are arranged at interval, and the heat-conducting wires 101 or fibers penetrate the front face 11 and rear face 12. The heat-conducting wires 101 or fibers are segregated by insulating material 102.

At least one LED unit 20 is incorporated onto the front face 11 of the composite heat-conducting substrate 10. Said LED unit 20 comprises an LED component 21 and electrode pin 22.

An electrode pad 30 made of conductive materials is incorporated onto the front face 11 of the composite heat-conducting substrate 10. The electrode pad 30 is electrically connected with the electrode pin 22 of LED unit 20.

An insulating layer 40 is incorporated onto the rear face 12 of the composite heat-conducting substrate 10, and located correspondingly to the electrode pad 30, thus avoiding short circuit of electrode pads 30 when the composite heat-conducting substrate 10 is connected with metal heat-sinking component. Of which said insulating layer 40 is printed by insulating resin containing ceramic powder.

A heat-conducting pad 50 made of heat-conducting materials is incorporated onto the front face 11 of the composite heat-conducting substrate 10, and kept in contact with the heat sink 25 of LED component 21 of the LED unit 20 for heat conduction.

Of which, a heat-sinking component 60 is mated onto the rear face 12 of the composite heat-conducting substrate 10. The heat-sinking component 60 is a heat-sinking fin made of either aluminum, copper or graphite.

Of which, the composite heat-conducting substrate 10 is positioned together with the heat-sinking component 60 via a fixture 13 and bolt 14, thus reducing the spacing between the composite heat-conducting substrate 10 and heat-sinking component 60. Due to elasticity of the fixture 13, this can prevent the loosening of the fixed position in response to thermal stress damage for the composite heat-conducting substrate 10 and heat-sinking component 60. More importantly, with the help of fixture 13, the composite heat-conducting substrate 10 can increase its available area without the need of a bolting hole, so LED units 20 can be laid onto the composite heat-conducting substrate 10 as much as possible.

Of which, the heat-conducting wires 101 or fibers are distributed in parallel, such that LED units 20 are conducted thermally and electrically along the heat-conducting wires 101 or fibers, but insulated in the direction of plane. In such a case, electrode pad 30 can be fabricated directly onto the composite heat-conducting substrate 10 without generating a short circuit.

Of which, said heat-conducting wire 101 or fiber is made of metal or carbon wire or fiber with a diameter of 0.05 mm-0.5 mm.

Of which, the insulating material 102 of the composite heat-conducting substrate 10 is thermoset or thermoplastic resin, or insulating ceramic or glass material. The resistivity of said insulating material 102 is higher than $10^9$ Ω·cm.

Of which, said electrode pad 30 and heat-conducting pad 50 are made of sputtering or electroplating metal film or printed solder paste. Said solder paste can be printed directly onto the composite heat-conducting substrate 10, then the electrode pad 30, heat-conducting pad 50 and composite heat-conducting substrate 10 can be mated stably by heating solder paste. Also, an insulating conductive gel can be filled onto the composite heat-conducting substrate 10 between electrode pad 30 and heat-conducting pad 50, so the heat energy of LED unit 20 will be transferred to the heat-conducting wire 101 or fiber.

Of which, the area of said heat-conducting pad 50 is 2-5 times of the electrode pad 30, so that the number of heat-conducting wires 101 can be increased to improve the channel of heat transfer and enhance heat transfer to heat-sinking component 60.

Based upon above-specified structural configuration, the present invention is operated as follows:

The heat energy generated by LED component 21 of LED unit 20 is transferred to the heat-conducting pad 50, then through mating of the heat-conducting wires 101 or fibers with the heat-sinking component 60, quickly transferred to the heat-sinking component 60 and dissipated into air through larger surface area of the heat-sinking component 60.

Figure 4:
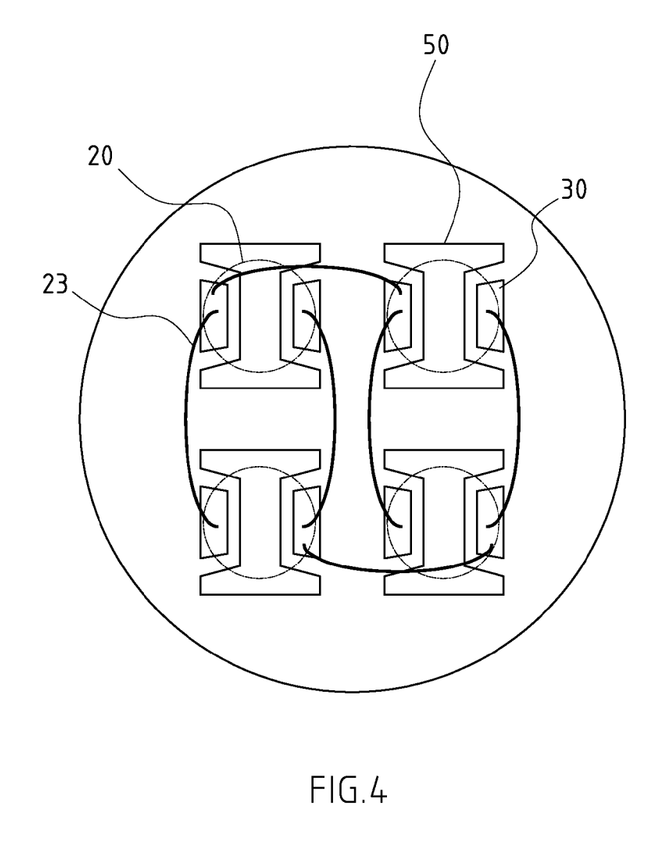
FIG. 4 is a schematic view wherein a plurality of LEDs is assembled onto a composite heat-conducting substrate.

Referring to FIG. 4, a schematic view shows the construction of heat-conducting substrate and thermal module of multiple LEDs, wherein the electrical connection between LED units 20 is implemented through external wire 23 in the form of a jumper, so that the heat can be dissipated into air through the metal jumper to increase the heat-sinking effect of LED.

As for the fabrication of composite heat-conducting substrate 10, the metal or carbon fiber for the heat-conducting wire 101 can be bundled, and insulating resin is poured or filled among the heat-conducting wires. After the resin is dried up and hardened, the resin bar containing bundled conducting wire is cut into a sheet to form the composite heat-conducting substrate 10 of the present invention containing parallel heat-conducting wires 101 or fibers. As for the fabrication of another composite heat-conducting substrate 10, the ceramic or glass plate containing parallel preformed holes is sintered into compact ceramic or glass plate, onto which metal solution or graphite paint is poured to form the heat-conducting wire for the fabrication of composite heat-conducting substrate 10.

Figure 5:
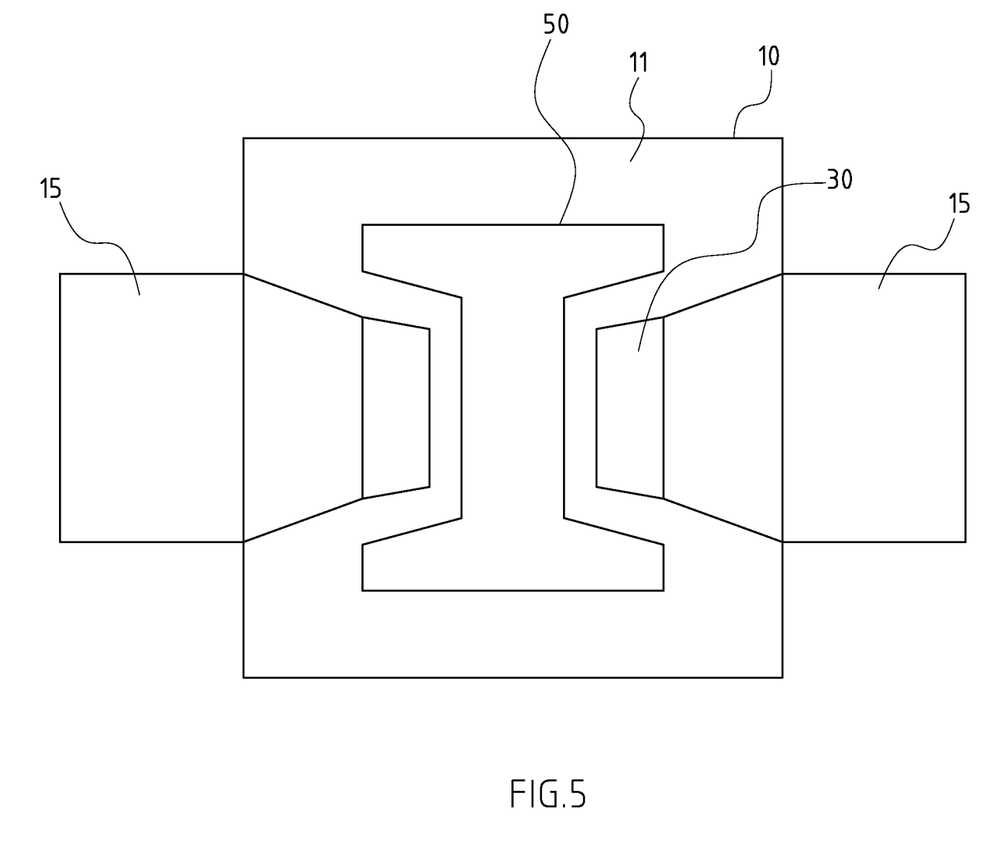
FIG. 5 is a top view wherein the composite heat-conducting substrate of the present invention is applied to an encapsulation of an LED chip.
Figure 6:
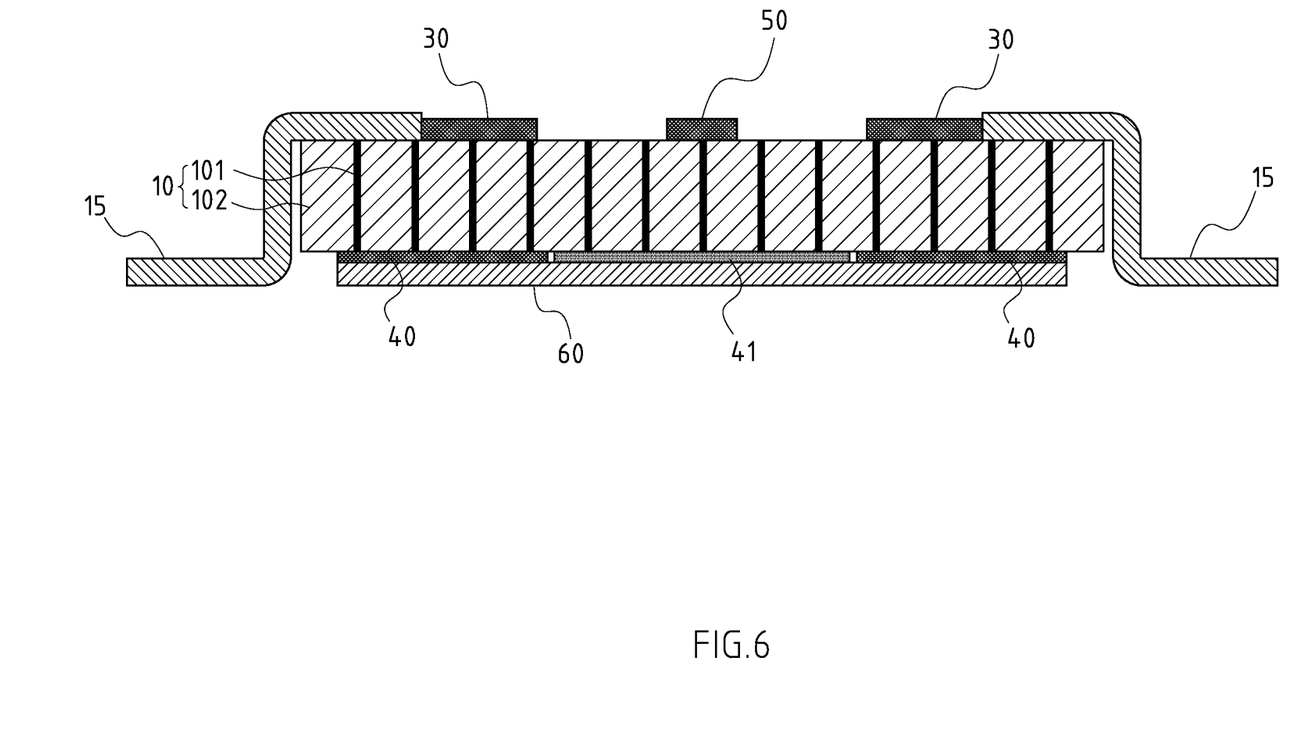
FIG. 6 is a schematic view wherein the composite heat-conducting substrate of the present invention is applied to an encapsulation of an LED chip.

Of which, said LED component 21 is made of either a component encapsulated by an electrode layer or a chip not yet encapsulated. Referring to FIGS. 5 and 6, the LED component 21 of the preferred embodiment is fixed by solder paste or by means of routing onto the composite heat-conducting substrate 10 with electrode pad 30 and heat-conducting pad 50, and pins 15 are fabricated onto the composite heat-conducting substrate 10. Meanwhile, the solder paste 41 on the rear face of the heat-conducting substrate 10 is mated with metal block as a heat sink, then structurally molded by molding compound or package encapsulation to form the predefined LED. In the preferred embodiment, solder paste 41 is mated between two insulating layers 40 on the rear face 12 of the composite heat-conducting substrate 10 correspondingly to the heat-conducting pad 50, thus linking the heat-sinking component 60 to obtain better heat transfer effect.

We claim:

1. A light-emitting diode (LED) apparatus comprising:
a heat-conducting substrate having a plurality of heat-conducting wires and an insulating material, said insulating material selected from the group consisting of a thermoplastic resin and a thermoset resin, said insulating material filling in gaps between said plurality of heat-conducting wires, said heat-conducting substrate baying a front face and a rear face, said plurality of heat-conducting wires being in spaced relation to each other and extending outwardly of said front and rear face of said heat-conducting substrate, said plurality of heat-conducting wires being segregated from each other by said insulating material after said insulating material has cured;
at least one LED unit affixed onto said front face of said heat-conducting substrate, the LED unit having an LED and a pair of electrode pins and a heat sink;
a pair of electrode pads formed of a conductive material and spaced from each other, each of said pair of electrode pads being planar and affixed onto said front face of said heat-conducting substrate, said pair of electrode pads being respectively connected to said pair of electrode pins of said LED unit;
an insulating layer affixed onto said rear face of said heat-conducting substrate, said insulating layer positioned in a location in correspondence to a location of the electrode pad; and
a heat-conducting pad formed of a heat-conducting material, said heat-conducting pad being separate from and spaced from said electrode pads, said heat-conducting pad positioned on adjacent said front face of said heat-conducting substrate, said heat-conducting pad being in contact with said heat sink of the LED unit so as to conduct heat therefrom.

2. The apparatus of claim 1, further comprising:
a heat-sinking component mated onto a rear face of said heat-conducting substrate.

3. The apparatus of claim 2, said heat-sinking component being a heat-sinking fin formed of a material selected from the group consisting of aluminum, copper and graphite.

4. The apparatus of claim 2, said heat-conducting substrate being connected to said heat-sinking component via a fixture and a bolt.

5. The apparatus of claim 1, said plurality of heat-conducting wires being arranged in parallel.

6. The apparatus of claim 1, each of said plurality of heat-conducting wires having a diameter of between 0.05 mm to 0.5 mm.

7. The apparatus of claim 1, said insulating material having a resistivity of greater than $10^9$ Ω·cm.

8. The apparatus of claim 1, said pair of electrode pads and said heat-conducting pad being of a metal film or a printed solder paste.

9. The apparatus of claim 1, said heat-conducting pad having an area two to five times an area of the electrode pad.

10. The apparatus of claim 1, said insulating layer being printed with an insulating resin-containing ceramic powder.

11. The apparatus of claim 1, the LED unit being fixed by a solder paste, the pair of electrode pins being fabricated onto said heat-conducting substrate.

* * * * *